(12) United States Patent
Claret et al.

(10) Patent No.: US 12,738,427 B2
(45) Date of Patent: Sep. 15, 2026

(54) HIGH-DENSITY CAPACITIVE DEVICE HAVING WELL-DEFINED INSULATING AREAS

(71) Applicant: COMMISSARIAT À L'ÉNERGIE ATOMIQUE ET AUX ÉNERGIES ALTERNATIVES, Paris (FR)

(72) Inventors: Thierry Claret, Grenoble (FR); Delphine Ferreira, Grenoble (FR); Raphael Ramos, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 689 days.

(21) Appl. No.: 17/806,018

(22) Filed: Jun. 8, 2022

(65) Prior Publication Data

US 2022/0399167 A1 Dec. 15, 2022

(30) Foreign Application Priority Data

Jun. 10, 2021 (FR) ........................................ 2106145

(51) Int. Cl.
*H01G 4/30* (2006.01)
*H01G 4/008* (2006.01)
(Continued)

(52) U.S. Cl.
CPC ............. *H01G 4/306* (2013.01); *H01G 4/008* (2013.01); *H10D 1/042* (2025.01); *H10D 1/716* (2025.01); *B82Y 30/00* (2013.01); *B82Y 40/00* (2013.01)

(58) Field of Classification Search
CPC ........ H01D 1/716; H01D 1/042; H01G 4/008; H01G 4/00; H01G 4/002; H01G 4/005;
(Continued)

(56) References Cited

U.S. PATENT DOCUMENTS

2005/0219788 A1* 10/2005 Chow .................... H01G 4/008 361/321.1
2006/0214262 A1 9/2006 Mosley et al.
(Continued)

FOREIGN PATENT DOCUMENTS

EP 3795721 A1 3/2021
WO 2021059570 A1 4/2021

OTHER PUBLICATIONS

Jeong, Soo-Hwan et al. "Packing Density Control of Aligned Carbon Nanotubes", Chemistry of Materials. Oct. 1, 2002, Vo. 14, No. 10, pp. 4003-4005.
(Continued)

*Primary Examiner* — Zachary M Davis
(74) *Attorney, Agent, or Firm* — Chrisman Gallo Tochtrop LLC

(57) ABSTRACT

A method for manufacturing a capacitive device comprising the following steps: i) provide a substrate comprising: a first area made of a first material and/or having a first texture, a second area made of a second material and/or having a second texture, a third area made of a third material and/or having a third texture, ii) make nanopillars grow over the substrate with which a nanopillar layer is obtained locally having different densities, the density of the first area being lower than the density of the third area, iii) deposit an insulating layer, iv) deposit a conductive layer, with which a capacitive stack is formed at the first area, the capacitive stack comprising the insulating layer and the conductive layer.

19 Claims, 6 Drawing Sheets

(51) Int. Cl.
*H10D 1/00* (2025.01)
*H10D 1/68* (2025.01)
*B82Y 30/00* (2011.01)
*B82Y 40/00* (2011.01)

(58) Field of Classification Search
CPC ........ H01G 4/306; B82Y 30/00; H10D 1/042; H10D 1/711; H10D 1/716
USPC .......................................................... 428/408
See application file for complete search history.

(56) References Cited

U.S. PATENT DOCUMENTS

| | | | |
|---|---|---|---|
| 2008/0197399 | A1 | 8/2008 | Hsu et al. |
| 2009/0035513 | A1 | 2/2009 | Bortner et al. |
| 2015/0200058 | A1 | 7/2015 | Rubloff et al. |

OTHER PUBLICATIONS

Song, Jingnan et al. "Fast Growth of Highly Ordered TiO2 Nanotube Arrays on Si Substrate under High-Field Anodization", Nano-Micro Letters, Nov. 9, 2016, vol. 9, No. 13, pp. 1-11.
Search Report for French application No. 2106145 dated Feb. 11, 2022.

* cited by examiner

HIGH-DENSITY CAPACITIVE DEVICE HAVING WELL-DEFINED INSULATING AREAS

CROSS-REFERENCE TO RELATED APPLICATIONS

This application claims priority from French Patent Application No. 2106145 filed on Jun. 10, 2021. The content of this application is incorporated herein by reference in its entirety.

TECHNICAL FIELD

The present invention relates to the general field of capacitive devices.

The invention relates to a method for manufacturing a high-density capacitive device, made over a structure with a high shape factor having improved insulating areas.

The invention also relates to a capacitive device obtained in this manner.

The invention is particularly interesting since it allows obtaining a high-density capacitive device (more than 1 μF/mm$^2$) having a good compactness and a good delimitation of the lower electrode and of the upper electrode in the space.

The invention finds applications in many industrial fields, and in particular for the manufacture of passive components and for 3D integration.

PRIOR ART

High-density capacitances are nowadays the object of intensive developments. In particular, these capacitances comprise a stack, called capacitive stack, provided with two or three layers, and formed over a surface or a structure having a high shape factor in order to limit the bulk of these capacitances.

Amongst the most effective capacitive devices, mention may be made of those obtained with a Metal/Insulator/Metal (MIM) deposition over the deployed surface of a porous alumina matrix (closed structure). This thin layer deposition type conformal despite the considerable aspect ratios is carried out by Atomic Layer Deposition (or ALD), in reactors with an “exposure” mode. In general, the capacitive area is defined by an opening in a hard mask. High-density capacitances (in the range of 1 μF/mm$^2$) with a breakdown voltage of a few volts could be obtained. These devices have begun supplying the markets.

The same ALD deposition technology could be implemented to make high-density capacitances with pillar-type (nanotubes or nanowires in particular) structures. The nanowires or the nanotubes, and more particularly the carbon nanotubes (CNT), which have a considerable surface/volume ratio, are ideal candidates for making these open structures with a high shape factor. For example, we will mention the pillars obtained by etching (Si tripods), the Carbon Nano-Tube (CNT) braids and the tubes of other natures obtained by growth (TiN tubes for example), the wires (Ni columns for example) obtained by Electrolytic Chemical Deposition (or ECD) through a porous matrix that is chemically eliminated later on. This technology based on CNTs or nanowires enables contact resumption for RF components (>GHz). However, the ALD deposits could be developed beneath the mask through the open 3D structure, which leads to a poorly delimited capacitive area.

To overcome this phenomenon, high-topology etched areas should be implemented. Indeed, the technology of the CNT-based capacitances could, for example, generate a topology with several tens of microns.

To date, the delimitation of the capacitance to a well-defined area and the treatment of the insulation of the high-density capacitive devices are not considered for nanopillar-type open structures.

DISCLOSURE OF THE INVENTION

The present invention aims to provide a method addressing the drawbacks of the prior art and allowing obtaining a high-density capacitive device, having a good insulation of the lower electrode and a well delimited capacitive area, the method should be simple to implement.

For this purpose, the present invention provides a method for manufacturing a capacitive device comprising the following steps:

provide a substrate comprising:
- a first area made of a first material and/or having a first texture,
- a second area made of a second material and/or having a second texture,
- a third area made of a third material and/or having a third texture,
- the first material being different from the third material and/or the first texture being different from the third texture,
- the first material may be identical to or different from the second material and/or the first texture may be identical to or different from the second texture, ii) make nanopillars, preferably carbon nanotubes or metal nanowires, grow over the substrate, with which a nanopillar layer is obtained locally having different densities, the nanopillars at the first area having a first density, the nanopillars at the second area having a second density, the nanopillars at the third area having a third density, the first density being lower than the third density, the first density may be identical to or different from the second density, iii) deposit an insulating layer over the nanopillar layer, the insulating layer covering the nanopillars in a conformal and continuous manner at least at the first area, iv) deposit a conductive layer, over the nanopillar layer, the conductive layer covering the insulating layer in a conformal and continuous manner at least at the first area, with which a capacitive stack is formed at the first area, the capacitive stack comprising the insulating layer and the conductive layer.

The invention differs from the prior art essentially by the implementation of a particular substrate to form an open structure formed by a nanopillar layer locally having different densities (i.e. different inter-nanopillar spaces). In particular, at the capacitive area (1$^{st}$ area), the nanopillars have a low density (i.e. they are spaced apart) enabling the deposition of the capacitive stack. At the insulating area of the upper electrode (3$^{rd}$ area), the nanopillars have a high density (i.e. they are tight), preventing the deposition of the conductive layer or its lateral progress beneath a mask, where appropriate.

According to a first advantageous variant, steps iii) and iv) are carried out by full-plate depositing the insulating layer and the conductive layer, the insulating layer and the conductive layer covering the nanopillar layer in a conformal manner at the first area and at the second area, so as to form a contact resumption at the second area, the insulating layer plugging the space between the nanopillars at the third area, with which an electrically insulating area is formed.

According to a second advantageous variant, between steps iii) and iv), the method includes a step during which a mask is formed over the nanopillar layer at the third area. During the deposition of the layers of the capacitive stack, the mask protects the third area. In addition, since the nanopillars have a higher density at the third area, this leads to a stoppage of the lateral progress of the ALD deposits at this insulating area.

According to this second advantageous variant, the mask may advantageously cover the nanopillar layer both at the second area and at the third area.

The capacitive stack may be formed by the insulating layer and the conductive layer (insulator/metal or IM layer).

Alternatively, the method may include an additional step, between step ii) and step iii), during which an additional conductive layer is deposited, the capacitive stack of the first area comprising the additional conductive layer, the insulating layer and the conductive layer. In other words, a metal/insulator/metal stack (MIM stack) is formed.

Advantageously, at the first area and/or at the second area, the spacing between the nanopillars is comprised between 60 nm and 140 nm.

Advantageously, at the third area, the spacing between the nanopillars is comprised between 10 nm and 20 nm.

According to an advantageous variant, the substrate provided at step i) comprises a main layer made of aluminium covered with an oxide layer, for example made of aluminium oxide, having through opening leading onto the main layer made of aluminium, a first through opening corresponding to the first area and a second through opening corresponding to the second area, a portion of the oxide layer disposed between the first area and the second area corresponding to the third area.

According to another advantageous variant, the substrate provided at step i) comprises a main layer made of aluminium covered with a first catalyst and with a second catalyst, the first area and the second area being formed at the first catalyst and the third area being formed at the second catalyst.

According to an advantageous variant, the substrate provided at step i) is obtained according to the following steps:

provide a substrate comprising a main aluminium layer, b) locally structure a first portion of the main aluminium layer by a first anodising process, so as to define a first area, c) locally structure a second portion of the main aluminium layer by a second anodising process, so as to define a second area, d) locally structure a third portion of the main aluminium layer by a third anodising process, so as to define a third area, e) carry out an etching step, with which a structured main aluminium layer is obtained comprising a first structure at the first area, a second structure at the second area and a third structure at the third area, the first structure being different from the third structure, the first structure being identical to or different from the second structure.

The different anodisation processes may be carried out at different potentials and/or durations leading to the formation of an alumina layer.

Advantageously, one single etching step will be carried out to remove the formed alumina. Alternatively, it is possible to remove the formed alumina after each anodisation step.

Advantageously, the substrate rests on a support comprising a dielectric layer, preferably made of silicon oxide, a trench being formed through the substrate up to the dielectric layer covering the support, the trench forming a fourth area. During step ii) nanopillars are grown at the fourth area, the nanopillars having a fourth density, the fourth density being higher than the first density and than the second density. The trench could be used as a separation area of the devices, as scribe lines or to dissociate the lower electrode.

Advantageously, the method further includes one or more of the following steps:

form an upper electrode over the capacitive area, form a contact resumption at the second area, form a lower electrode over the contact resumption, separate the capacitive devices formed over the same substrate at the level of the trenches.

The method has many advantages:

such an arrangement allows simplifying the technological stack, the layers of the capacitive stack may be full-plate deposited, without using any mask, which simplifies the manufacturing method, and reduces the manufacturing costs, in the case where masks are used, there is no stoppage of the lateral progress of the layers deposited by ALD, thanks to the different densities of the nanopillars, the topology is controlled, an optimisation of the set-up, enable an ideal contact resumption for RF devices, there is no need for etching, to form the capacitive area, the contact resumption area and the insulating area, an ease of the process to insulate the lower electrode despite the high topology.

The invention also relates to a high-density capacitive device obtained according to the previously-described method, comprising:

a substrate comprising:

a first area made of a first material and/or having a first texture, a second area made of a second material and/or having a second texture, a third area made of a third material and/or having a third texture, the first material being different from the third material and/or the first texture being different from the third texture, the first material may be identical to or different from the second material and/or the first texture may be identical to or different from the second texture, a layer of nanopillars, preferably carbon nanotubes or metal nanowires, covering the substrate and locally having different densities, the nanopillars at the first area having a first density, the nanopillars at the second area having a second density, the nanopillars at the third area having a third density, the first density being lower than the third density, the first density may be identical to or different from the second density, a capacitive stack covering the nanopillars in a conformal and continuous manner, at the first area, so as to form a capacitive area, the capacitive stack comprising the insulating layer and the conductive layer, and possibly an additional conductive layer between the nanopillars and the insulating layer.

For example, the capacitive stack comprises a conductive layer made of TiN, an insulating layer made of $Al_2O_3$, and possibly an additional conductive layer made of TiN, disposed between the insulating layer and the nanopillars.

The invention differs from the prior art essentially by the presence of a layer of nanopillars locally having different densities.

The capacitive device has a more controlled topology, and especially an optimised set-up. The device also comprises a contact resumption at the second area. It consists of an electrically-conductive element partially or completely filling the space between the nanopillars at the second area.

Advantageously, the contact resumption is formed by a capacitive stack identical to the capacitive stack of the first area. The capacitive stack covers the nanopillars in a conformal and continuous manner at the second area.

Such a contact resumption of the lower electrode allows considering RF components operating beyond the GHz range.

The configuration and/or the arrangement of such a capacitive device allows conferring a better compactness on the latter in comparison with known devices of the prior art.

Advantageously, the insulating layer completely fills the space between the nanopillars at the third area, with which an insulating area is formed between the capacitive area and the contact resumption area.

Advantageously, the substrate rests on a support covered by a dielectric layer, preferably a silicon oxide layer, a trench being formed through the substrate up to the dielectric layer covering the support, the trench forming a fourth area. Even more advantageously, nanopillars having a fourth density fill the trench, the fourth density being higher than the first density and than the second density.

Advantageously, the device further comprises one or more of the following elements:

an upper electrode covering the capacitive area, a lower electrode covering the contact resumption.

Thus, the obtained capacitive structure includes:

an open nanopillar structure, having a high shape factor and locally having different inter-pillar spaces, disposed over the substrate, a substrate, electrically connected to the lower electrode, a capacitive area, formed by a first area (or a portion) of the open nanopillar structure covered in a conformal and continuous manner with a bi-layer IM or tri-layer MIM capacitive stack, a contact resumption area BF and/or RF disposed at a second area (or a portion) of the open nanopillar structure, and formed thanks to a conductive material deposit between the nanopillars, the deposit may possibly completely fill the space between the nanopillars.

The device has many advantages:

the use of an ALD-type deposition allows obtaining a thin layer, maximising the capacitance, the entire capacitive area could be used, a good insulation of the lower electrode and a well delimited capacitive area, the open nanopillar structure is, advantageously, used to connect the lower electrode, the separation area enables an insulation of the lower electrode of each device and/or the formation of scribe lines.

Other features and advantages of the invention will completely appear from the following complementary description.

It goes without saying that this complementary description is given only as an illustration of the object of the invention and should, in any case, be interpreted as a limitation of this object.

BRIEF DESCRIPTION OF THE DRAWINGS

The present invention will be better understood upon reading the description of embodiments provided for merely indicative and non-limiting purposes with reference to the appended drawings wherein.

The different portions represented in the figures are not necessarily to a uniform scale, to make the figures more readable.

The different possibilities (variants and embodiments) should be understood as not exclusive of one another and could be combined together.

Furthermore, in the description hereinafter, terms that depend on the orientation, such as “top”, “over”, “bottom”, “beneath”, etc. of a structure apply while considering that the structure is oriented as illustrated in the figures.

DETAILED DISCLOSURE OF PARTICULAR EMBODIMENTS

Although this is not restrictive in any manner, the inventions particularly apply in the field of high-density capacitances of 1 $\mu F/mm^2$. Advantageously, the capacitive device may be integrated into a structure comprising other components.

The principle underlying the method for manufacturing a capacitive device according to the invention consists in generating an open structure comprising nanopillars having different densities, each area with a particular density corresponding to a functional area of the capacitive device. In particular, the areas having a considerable free inter-pillar space may correspond:

to the capacitive areas Z1, where the space will be enough to deposit an insulator/metal (IM) or metal/insulator/metal (MIM) type capacitive stack by ALD, to the contact resumption areas Z2, where the inter-pillar space will, advantageously, be similar to those of the capacitive areas.

The areas having a limited free inter-pillar space where:

the first deposit (in the case of a capacitive stack IM), or the second two deposits (in the case of a capacitive stack MIM) will saturate the inter-pillar spaces preventing the deposit of the conductive metal of the upper electrode.

These areas may correspond:

to the insulating areas Z3 (also called neutral area) between the capacitive areas and the contact resumption ones, to the separation areas Z4 of the lower electrodes of the different devices generated on the substrate, forming scribe lines.

Figure 1A:
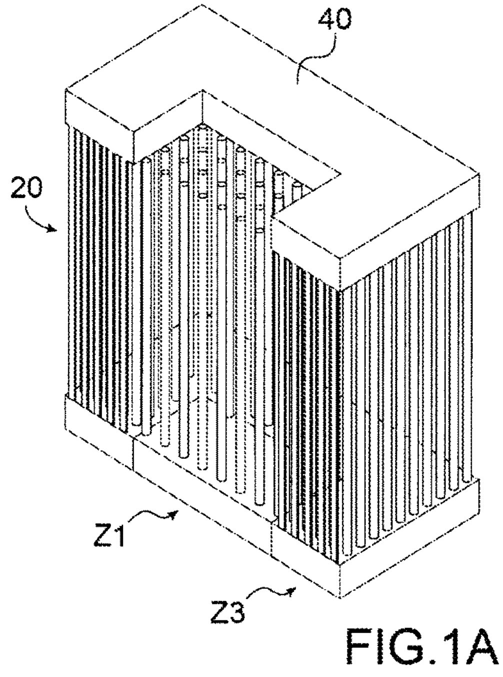
FIGS. 1A to 1D schematically represent, in three dimensions, different steps of a method for manufacturing a capacitive device according to a particular embodiment of the invention.

For illustration, FIG. 1A represents a substrate 10 covered with a layer 20 of nanopillars (for example, carbon nanotubes) having a first density at the capacitive area Z1 and having another density at the insulating area Z3. The density of the CNTs of the capacitive area Z1 is lower than the density of the CNTs of the insulating area Z3. The insulating area Z3 is covered with a mask 40.

Figure 1B:
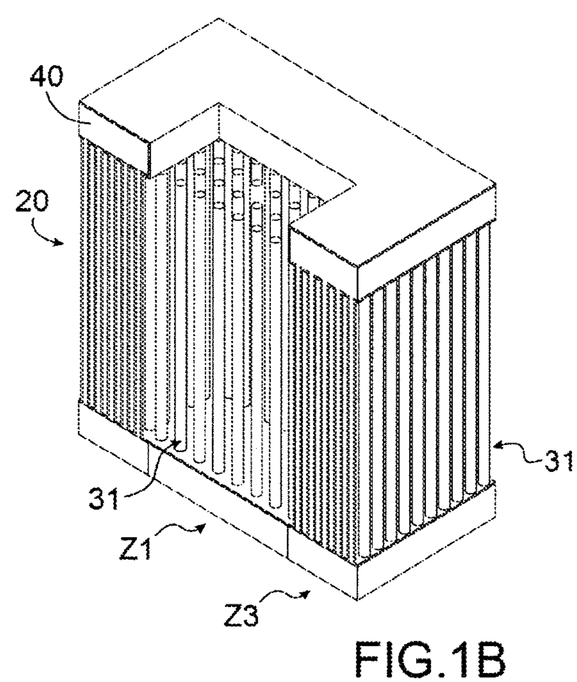
Figure 1C:
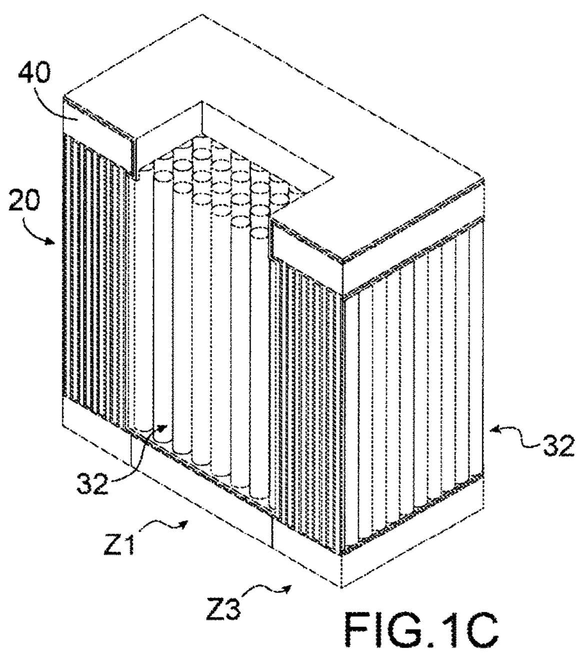
Figure 1D:
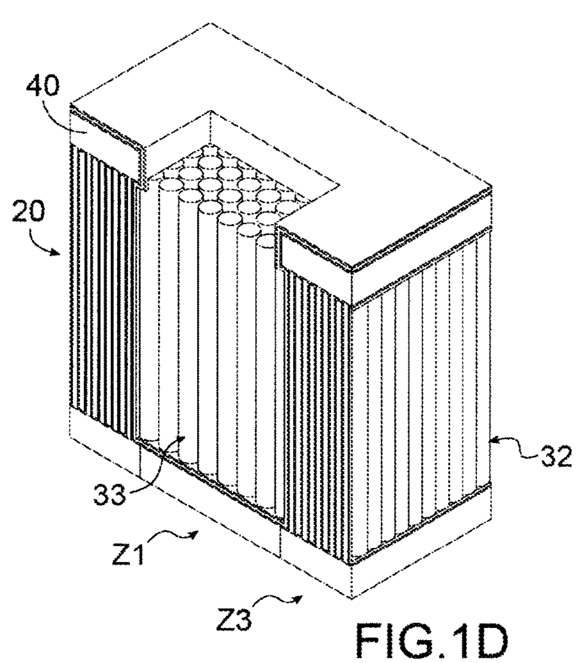

Afterwards, a MIM-type capacitive stack 30 is formed by ALD by successively depositing:

a first metal layer 31: the metal deposit covers the CNTs of the first area and progresses beneath the hard mask (FIG. 1B), an insulating layer 32: the metal deposit covers the CNTs of the first area and the portion of the CNTs structure with the highest density ($2^{nd}$ area) is saturated (FIG. 1C), another metal layer 33: the deposit is limited to the low-density area ($1^{st}$ area), there is no lateral progress of the ALD deposit beneath the mask (FIG. 1D).

According to an advantageous variant, it is possible to use no mask 40 since the open structure of the insulating area Z3 is saturated after the deposition of the insulating layer. Only the complete MIM capacitive stack 30 will be obtained at the capacitive area Z1.

Figure 2A:
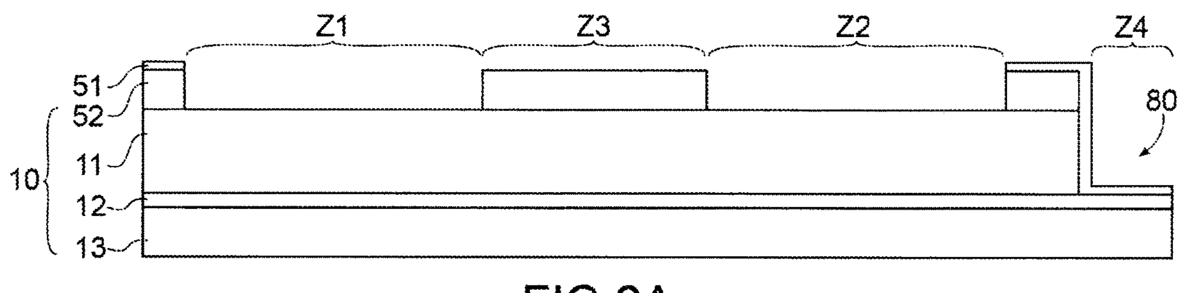
FIGS. 2A to 2E schematically represent different steps of a method for manufacturing a capacitive device according to another particular embodiment of the invention—the inserts of FIG. 2C representing, schematically and in section, the layers disposed over the nanopillars at the areas Z1, Z2, Z3 and Z4.
Figure 2B:
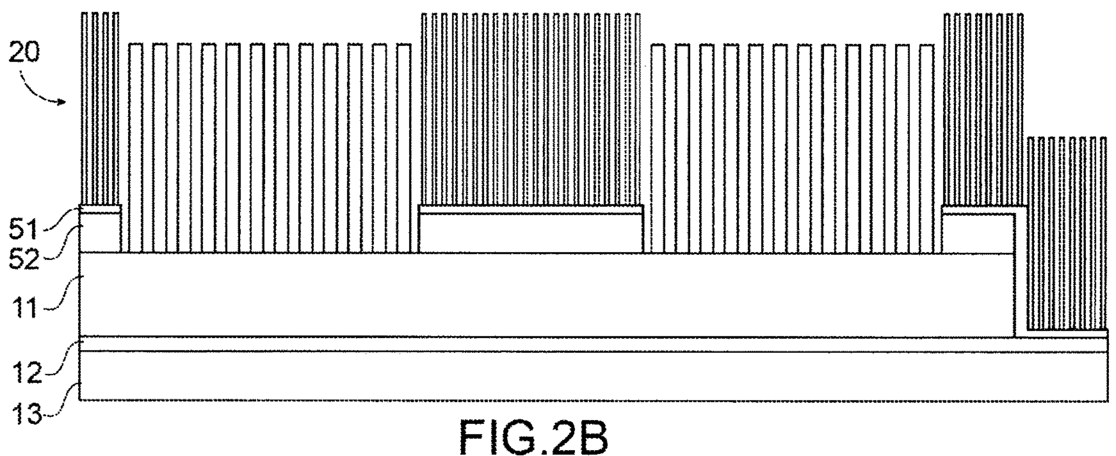
Figure 2C:
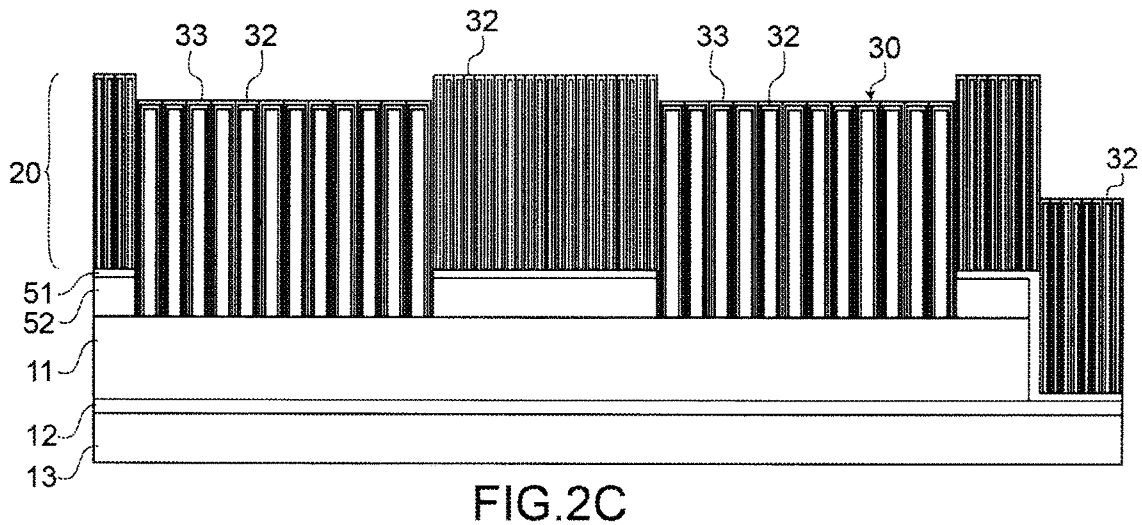
Figure 2D:
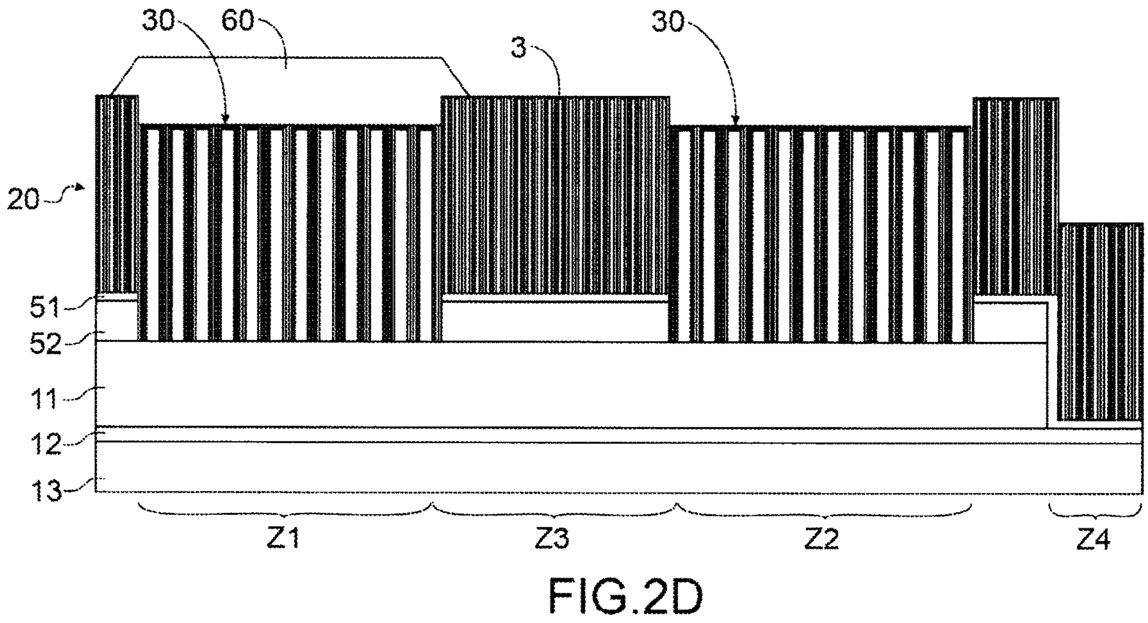
Figure 2E:
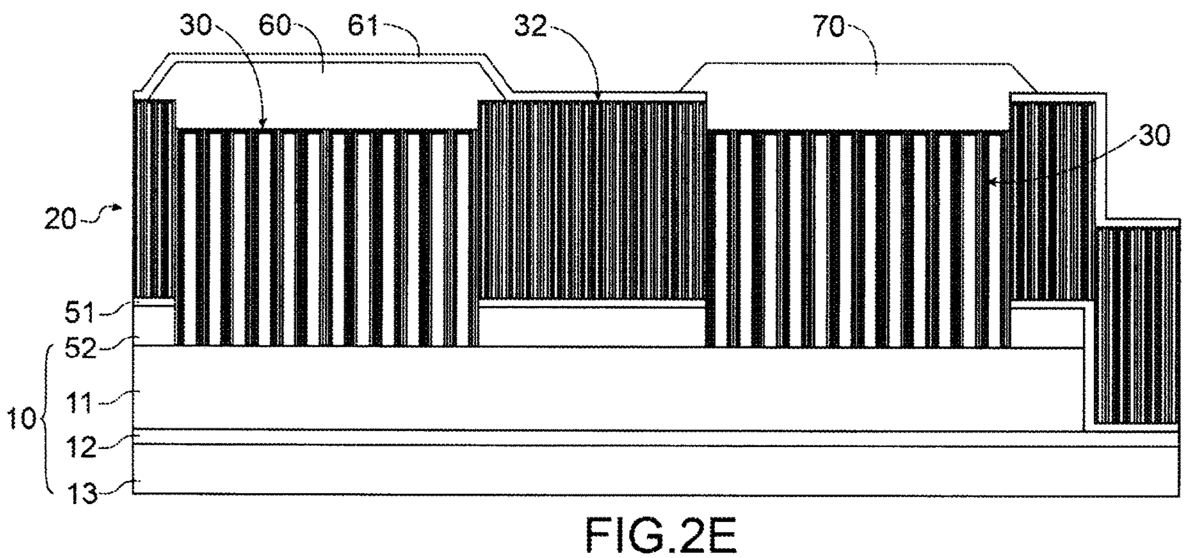
Figure 3A:
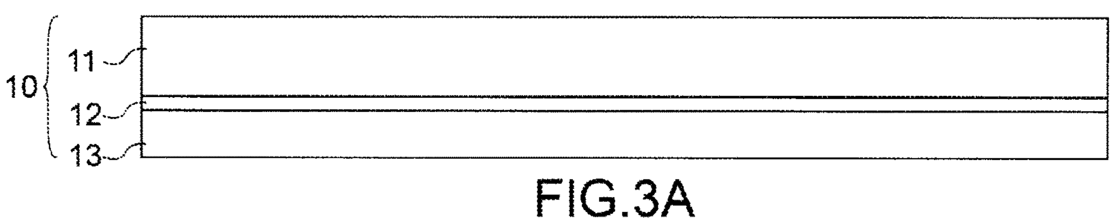
FIGS. 3A to 3F schematically represent different steps of a method for manufacturing a capacitive device according to another particular embodiment of the invention.
Figure 3B:
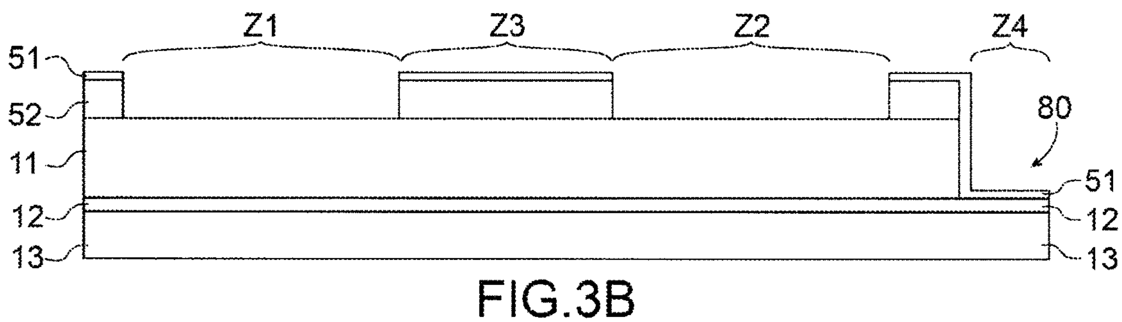
Figure 3C:
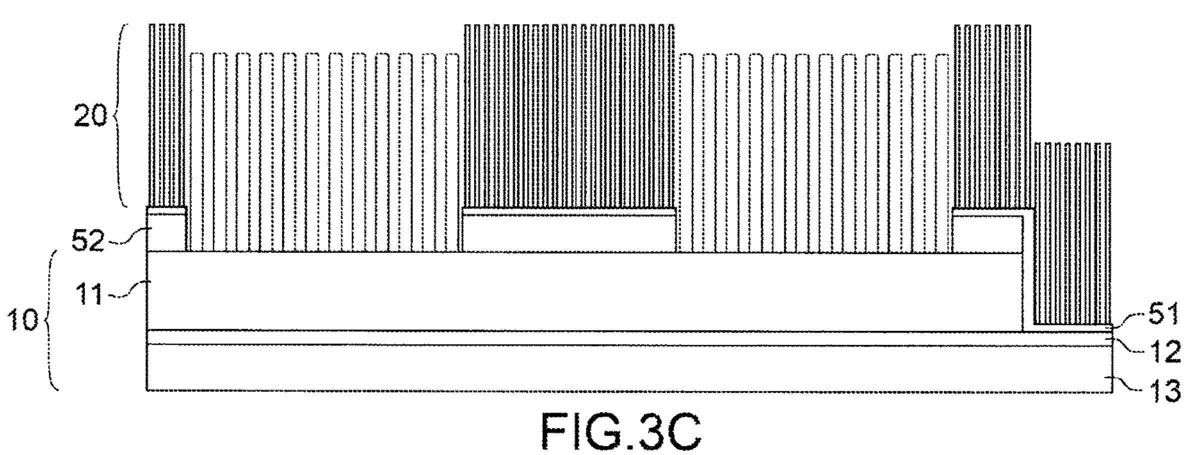
Figure 3D:
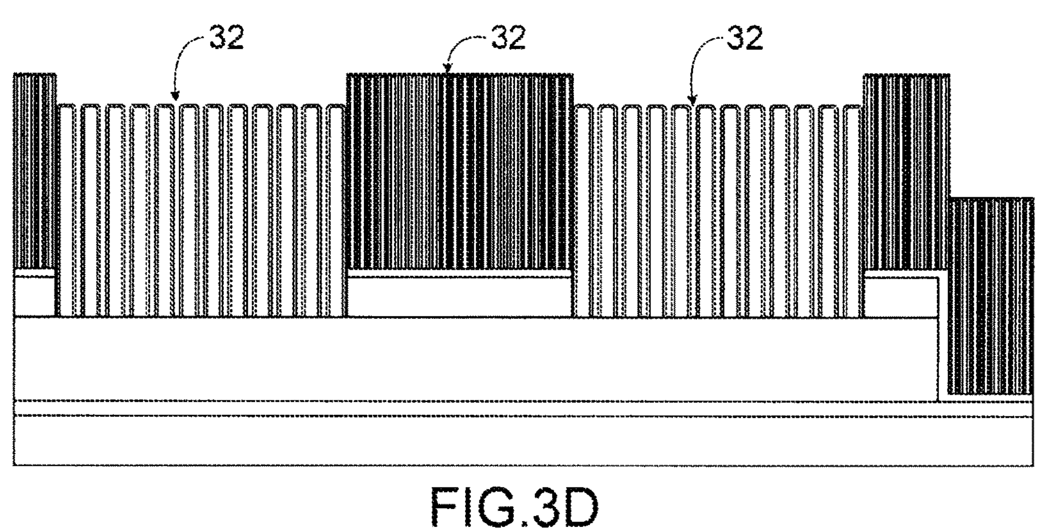
Figure 3E:
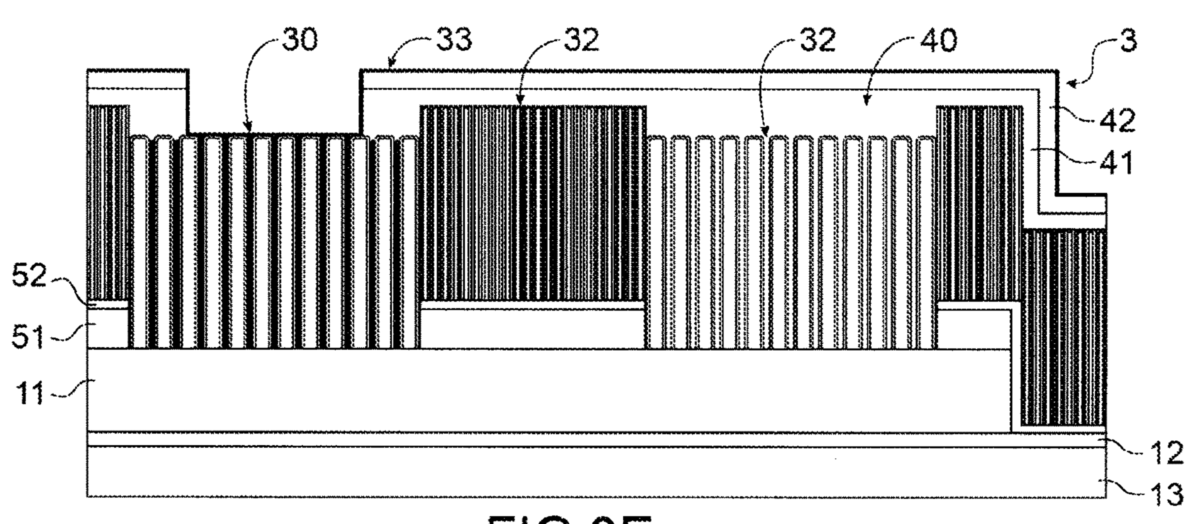
Figure 3F:
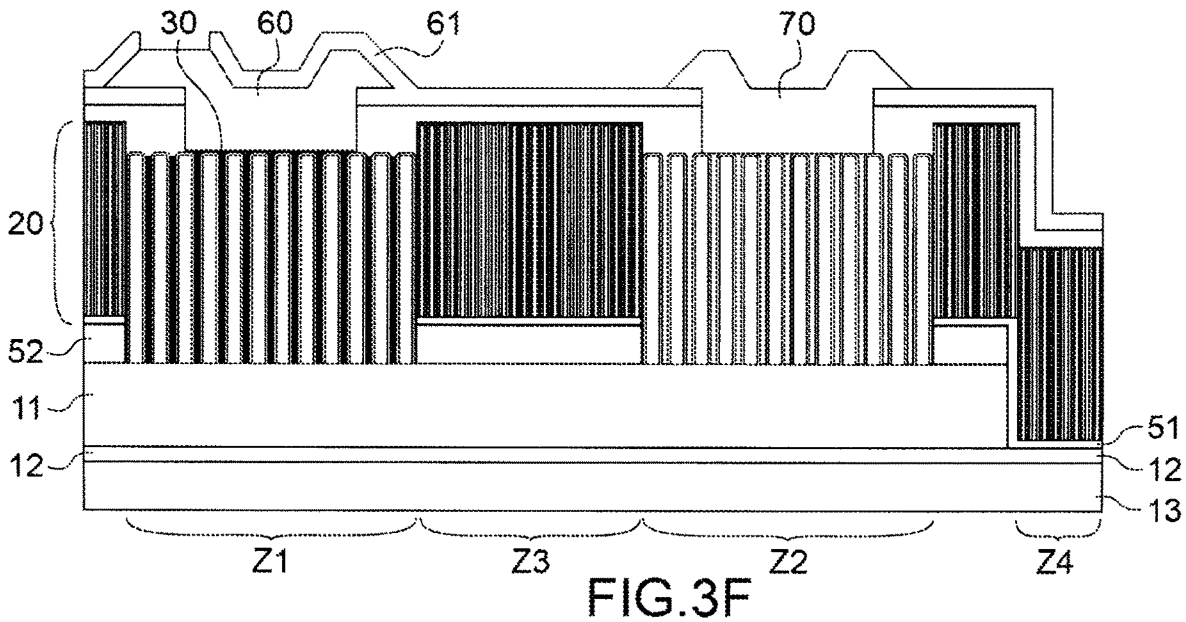

We will now describe in more detail two methods for manufacturing a capacitive device according to the invention with reference to FIG. 2A to 2E or to FIGS. 3A to 3F. These methods comprise the following steps:

provide a substrate 10 comprising:

a first area Z1 made of a first material and/or having a first texture, a second area Z2 made of a second material and/or having a second texture, a third area Z3 made of a third material and/or having a third texture, the first material being different from the third material and/or the first texture being different from the third texture, the first material may be identical to or different from the second material and/or the first texture may be identical to or different from the second texture (FIG. 2A and FIG. 3B), ii) make nanopillars, preferably carbon nanotubes or metal nanowires, grow over the substrate, with which a nanopillar layer 20 is obtained locally having different densities, the nanopillars at the first area Z1 having a first density, the nanopillars at the second area Z2 having a second density, the nanopillars at the third area Z3 having a third density, the first density and the second density being lower than the third density, the first density may be identical to or different from the second density FIG. 2B and FIG. 3C, iii) deposit an insulating layer 32 over the nanopillar layer 20, the insulating layer 32 covering the nanopillars in a conformal and continuous manner at least at the first area Z1 (FIG. 3D), and iv) deposit a conductive layer 33, over the nanopillar layer 20, the conductive layer 33 covering the insulating layer 32 in a conformal and continuous manner at least at the first area Z1, with which a capacitive stack 30 is formed at the first area Z1, the capacitive stack 30 comprising the insulating layer 32 and the conductive layer 33, and a contact resumption at the second area Z2 (also called contact resumption area) (FIG. 2C and FIG. 3E), v) form an upper electrode 60 over the first area Z1 (FIG. 2D), vi) form a lower electrode 70 over the contact resumption area (FIG. 2E, FIG. 3F).

According to a first variant, steps iii) and iv) may be carried out by depositing the insulating layer 32 and the full-plate conductive layer 33: the insulating layer 32 and the conductive layer 33 cover the nanopillar layer 20 in a conformal manner at the first area Z1 and at the second area Z2, so as to form, respectively a capacitive area and a contact resumption area.

The insulating layer 32 plugs the space between the nanopillars at the third area Z3, with which an electrically-insulating area Z3 is formed (FIG. 2C).

According to another non-represented variant, between steps iii) and iv), the method may include a step during which a mask is formed over the nanopillar layer 20 at the third area Z3 to protect it during the deposition of the capacitive stack.

According to another variant, between steps iii) and iv), the method may include a step during which a mask 40 is formed over the nanopillar layer 20 at the third area Z3 and at the second area Z2 (FIG. 3E).

The substrate 10 provided at step i) comprises a front face and an opposite rear face essentially parallel to the front face. Advantageously, the substrate 10 comprises several layers.

Preferably, the substrate comprises a main layer 11. Advantageously, the main layer is made of metal and preferably of aluminium. The main layer 11 may have a thickness comprised between 0.5 μm and 5 μm.

The main layer 11 may be in contact with a dielectric layer 12, in particular an oxide layer. The dielectric layer 12 may rest on a support 13. Thus, the dielectric layer 12 is interposed between the support 13 and the main layer 11 (FIGS. 2A and 3B). In other words, the main layer 11 may be deposited directly over the support 13.

For example, the support 13 is a silicon substrate. For example, the thickness of the support 13 is 725 μm.

For example, the dielectric layer 12 is a silicon oxide layer. For example, the thickness of the dielectric layer 12 is 0.5 μm.

The main layer 11 may be formed over the substrate 13 or over the dielectric layer 12 by a deposition or evaporation technique. Advantageously, the main layer 11 is full-plate deposited.

Starting from this substrate 10, it is possible to form different textures (for example different roughness) and/or areas with different kinds allowing growing nanopillars having a particular density for each area.

For example, it is possible to grow the nanopillars over:

a substrate made of the same material locally having different textures, or a substrate locally having areas made of different materials, having the same texture, or a substrate locally having areas made of different materials, having different textures.

Advantageously, the catalyst used for the growth of the nanopillars is the same on the different areas. Alternatively, several catalysts may be used subject to the implementations of steps of localising the catalyst (masking, removal ("lift-off"), etc.).

According to an advantageous embodiment, the main layer 11 of the substrate 10 is textured (FIG. 3A). To texture a metallic main layer 11, it is possible, for example, to carry out an anodisation step and then an etching step successively.

Advantageously, the main layer 11 is anodised so as to form an oxide superficial layer. In the case of a main layer 11 made of aluminium, an aluminium oxide layer ($Al_2O_3$ also called alumina) is formed.

Then, the formed oxide layer is etched so as to reveal the texture at the surface of the main layer 11 due to the anodisation.

Anodisation is an electrolytic process occurring in a wet environment. The principle is based on the application of an imposed potential difference between two conductive electrodes immersed into an electrolytic solution which could, for example, be oxalic or phosphoric acid. The application of a potential to the anode, induces an alumina growth at its surface, if the electrode is made of aluminium, and a texturing of the aluminium. The dissolution of the alumina in an acid bath reveals a texturing at the surface of the metal.

As regards etching, buffered low-acid solutions will be generally selected.

Advantageously, these steps are carried out full-plate. No mask is needed. Thus, a main layer 11 of aluminium is obtained having, at the front face, an organised preformed surface (FIG. 3A).

The main layer 11 may have the same texture.

According to another embodiment, the main layer 11 may locally have different textures. For example, it is possible to locally carry out different anodisations through different masks, so as to form different textures in the main layer 11. For example, we will locally carry out:

a first anodisation on a first portion of the main layer 11 at a first potential (for example 90V) to form the first area Z1, a second anodisation on a second portion of the main layer 11 at a second potential to form a second area Z2, and a third anodisation on a third portion of the main layer 11 at a third potential (for example 60V), the third potential being lower than the first potential, to form a third area Z3.

A subsequent etching step will allow removing the formed oxide layer 14, with which a main layer 11 is obtained comprising a first structure at the first area and a second structure at the second area and a third structure at the third area. The first structure is different from the third structure. The first structure is identical to or different from the second structure. Preferably, the first structure is identical to that one of the second structure and the second anodisation and the second anodisation are carried out during the same step.

It is possible to make the nanopillars grow directly over the locally textured main layer.

Alternatively, it is possible not to texture the main layer 11 and locally form areas made of different materials over this layer.

According to another alternative, it is possible to texture (locally or full-plate) the main layer 11 and locally form areas made of different materials over this main layer 11.

According to a first embodiment, represented in FIG. 3B, the main layer 11 is a textured layer, preferably made of aluminium. It is covered with an insulating layer for example a bi-layer of oxide 52 and alumina 51, having through openings leading onto the main layer 11, a first through opening corresponding to the first area Z1 and a second through opening corresponding to the second area Z2, a portion of the oxide layer 52 disposed between the first area Z1 and the second area Z2 corresponding to the third area Z3.

Advantageously, a fourth area Z4 (separation area) is formed by etching the layer 11 opening onto the insulating layer 12 and embedded in a conformal insulating layer 51.

Advantageously, before the deposition of the conformal insulating layer 51 (ALD alumina layer for example), the method may also include a step during which a trench 80 is formed in the substrate 10 up to the dielectric layer 12 covering the support 13 (FIG. 3B). The trench 80 forms a fourth area in the substrate 10. The fourth area Z4 corresponding to a separation area of the devices. For example, this trench 80 may be used to form scribe lines or to dissociate the lower electrode 11.

Advantageously, during step ii), nanopillars are formed in this fourth area Z4. The nanopillars have a fourth density. The fourth density is higher than the first density of the capacitive area Z1 and than the second capacitance of the contact resumption area Z2.

According to a second embodiment, the substrate 10 provided at step i) comprises a metallic main layer 11, preferably made of aluminium, covered with a first catalyst at the first area and at the second area and with a second catalyst at the third area. This structure may be obtained by locally depositing the first catalyst and the second catalyst.

Alternatively, this structure may be obtained by depositing the first catalyst and then the second catalyst, for example in the form of thin layers, openings in the layer of the second catalyst leaving the layer of the first catalyst accessible, a first opening corresponding to the first area Z1 and a second opening corresponding to the second area Z2, a portion of the layer of the second catalyst disposed between the first area Z1 and the second area Z2 corresponding to the third area Z3.

The first catalyst and/or the second catalyst may be in the form of a layer, for example made of iron, or of a stack of layers, for example a Fe/Ti/Al/Fe stack.

An oxide layer may be disposed between the main layer 11 and the first catalyst and/or the second catalyst.

It is possible to combine the previously-described embodiments, and in particular carry out local anodisations at different potentials and deposit different catalysts.

During step ii), a nanopillar layer 20 is grown. It may consist of carbon nanotubes or of metallic nanowires (FIG. 2B or FIG. 3C).

The formation of the metallic nanowires or of the carbon nanotubes may be achieved through a growth step implementing standard techniques. In particular, the carbon nanotube harnesses may be formed by DC-PECVD or DCVD at a temperature in the range of 400° C. with different precursors and catalysts. Advantageously, the carbon nanotube harnesses are formed by thermal or hot-filament assisted CVD at temperatures, for example, in the range of 550° C.

The nanotubes or the nanowires may have an average length comprised between 2 μm and 40 μm, advantageously comprised between 2 μm and 12 μm.

For example, the nanowires are tungsten, copper or nickel nanowires.

The nanowires form a network of nanowires.

The nanotubes form a network of nanotubes.

The nanowires or the nanotubes, and more particularly the carbon nanotubes, which have a considerable surface/volume ratio, are ideal candidates for making these structures with a high shape factor.

Upon completion of step ii), at the first area Z1 and/or at the second area Z2, the spacing between the nanopillars is comprised between 60 nm and 140 nm.

Advantageously, at the third area Z3, the spacing between the nanopillars is comprised between 10 nm and 20 nm.

During steps iii) and iv), an insulating layer 32 and a conductive layer 33 are successively deposited to form a capacitive stack 30 at least at the first area Z1, and possibly at the second area Z2. The continuous capacitive stack 30 comprises an upper conductive layer 33 and a layer 32 insulating the upper conductive layer 33 of the nanopillars.

During steps iii) and iv), an insulating layer 32 and a conductive layer 33 are successively deposited to form a capacitive stack 30 at least at the first area Z1, and possibly at the second area Z2. The continuous capacitive stack 30 comprises an upper conductive layer 33 and an insulating layer 32 insulating the upper conductive layer 33 of the nanopillars.

The method has been described for an insulator/metal capacitive stack, but it could also be made for a metal/insulator/metal (MIM) type capacitive stack. According to this variant, the method comprises an additional step, between step ii) and step iii), during which an additional conductive layer 31 is deposited, the capacitive stack of the first area Z1 successively comprising the additional conductive layer 31, the insulating layer 32 and the conductive layer 33.

Even though the manufacture of a MIM capacitive stack rather than an IM capacitive stack seems to complicate the stack, this variant has several advantages:

- the contact resistance of the CNTs on the aluminium is suppressed, which resistance directly affects the characteristics of the capacitance in particular the equivalent series resistance (ESR),
- the first conductive layer 31 should also penetrate into the CNT braid and reduce the ESR even further,
- with an equivalent CNT braid, the diameter of the capacitance and the developed surface will increase and therefore the density ($\mu F/mm^2$) will be even more considerable.

Thus, very good electrical performances may be reached with a MIM.

The simultaneous overlap of the nanopillars of the contact resumption area Z3 and of the capacitive area Z1 allows limiting the number of steps of the method.

The deposition of the MIM or IM may be carried out through successive depositions by an atomic layer deposition (ALD) technique. This particularly conformal deposition technique allows depositing the stack over and between the nanopillars until contacting the substrate, accessible between the nanopillars.

The first conductive layer 31 is brought into contact with the substrate 10 located at the bottom of the nanopillar layer 20. For example, this first conductive layer 31 may be made using an ALD-type deposition technique. For example, the used materials may consist of TiN, TaN, NiB, Ru or any other conductive material.

The insulating layer 32 of the capacitive stack 30, allows creating the capacitance between the upper conductive layer 33 and the lower conductive layer 31. The material used to make this dielectric layer should have the highest possible electric permittivity k in order to maximise the obtained capacitance value. Several types of materials, called "High-k" materials, preferably with an electric permittivity (k>6) may be used such as silicon nitride ($Si_3N_4$), alumina (aluminium oxide), hafnium oxide ($HfO_2$), or any other material having an electric permittivity k higher than or equal to the aforementioned materials. In addition, the used materials should be compatible with the technological processes used for the manufacture of the structure with a MIM-type capacitance.

For example, the thickness of the insulating layer 32 is comprised between 5 nm and 80 nm (1 nm=$10^{-9}$ m), preferably it may be formed with a thickness in the range of 10 nm.

The deposition processes allowing obtaining the insulating layer 32 may use different techniques known to a person skilled in the art. As example, the Atomic Layer Deposition (or ALD), or the Low-Pressure Chemical Vapour Deposit (or LPCVD) may preferably be used.

Afterwards, the second conductive layer 33 of the capacitive stack 30 is deposited thereby allowing creating the MIM-type capacitance. The characteristics of this second conductive layer as well as the deposition methods may be identical to those used to make the first conductive layer.

The lower conductive layer 31 may be made of titanium nitride.

The upper conductive layer 33 may be made of titanium nitride.

The insulating layer 32 may be made of alumina.

Preferably, the capacitive stack 30 is an $Al_2O_3$/TiN bi-layer or a TiN/$Al_2O_3$/TiN tri-layer.

Advantageously, during steps iii) and iv), a mask 40 allows protecting the neutral area Z3 during the deposition of the capacitive stack 30.

It may be manufactured according to the following sub-steps:

- a sub-step of depositing a first dielectric layer 41, for example a silicon oxide layer,
- a sub-step of depositing a second dielectric layer 42, for example a silicon nitride layer, so as to form a dielectric stack,
- a photolithography/etching sub-step intended to preserve the stack exclusively at the neutral area Z3.

For example, the first 41 and second 42 layers may have a thickness comprised between 10 nm and 1,000 nm.

The first dielectric layer 41 may comprise TEOS and have a thickness comprised between 100 and 1,000 nm, for example equal to 500 nm.

The second dielectric layer 42, formed overlapping the first dielectric layer 41, may have a thickness comprised between 100 nm and 500 nm.

During the photolithography, etching and photosensitive resin removal ("stripping") steps, a first pattern is defined in the second dielectric layer 42 so that the latter forms a hard mask. The second pattern is obtained by dry etching through this hard mask protecting the structure (CNT, wires . . . ) from any wet process. It should be understood that the first pattern and the second pattern form through openings in the dielectric layer 40. In particular, this first pattern and this second pattern allow delimiting the capacitive area and the contact resumption area respectively.

During step v), the upper electrode 60 is formed over the first area Z1 (FIG. 2D).

The upper electrode 60 formed during step e) is obtained by depositing a metal layer. The upper electrode 60 has a thickness, for example in the range of 1 μm to 5 μm. For example, the metals used for the upper electrode may consist of aluminium (Al), copper (Cu), silver (Ag) combined, or not, with barrier metals such as titanium nitride (TiN), or tantalum nitride (TaN). For example, it may consist of an AlCu alloy.

The upper electrode 60 is arranged so as to electrically contact the upper conductive layer 33 of the capacitive stack 30. The upper electrode 60 may be covered with one or several insulating material layer(s). A contact resumption in the form of a metallic plot ("UBM" or "Upper Bump Metallurgy") may be formed throughout the layer or layers made of insulating materials. It may consist of a silicon oxide layer, a silicon nitride layer or a bi-layer comprising the aforementioned two layers.

The upper electrode 60 may have a slight overlap with the dielectric layers if the neutral area Z3.

Afterwards, during step vi), the lower electrode 70 is formed over the contact resumption area Z2. Step vi) may be carried out according to a protocol similar to that one used for the formation of the upper electrode 60 (step v). The contact plot for the lower electrode 70 may be made of a material identical to or different from that one of the electrode 60. For example, the lower electrode plot 70 is made of AlCu.

The plot of the lower electrode 70 may be covered with an insulating material layer 71. A contact resumption in the form of a metallic plot ("UBM") may be formed through this layer.

Between step v) and step vi), it is advantageously possible to carry out the following steps:

- etch the upper layer of the capacitive device (10 nm of TiN) through the hard mask of the conductive layer 60,
- deposit a protective layer 61 over the upper electrode 60, to protect the upper electrode 60 in preparation of the step intended to expose the lower contact area Z2 to the external environment; for example, it is possible to form a dielectric layer 61 overlapping the upper electrode 60,
- etch the capacitive stack 30 at the second area Z2 so as to make the nanopillars accessible at the second area Z2, and thus allow exposing the lower contact area ZCI to the external environment.

One or several contact plot(s) may be formed at the upper electrode and/or the lower electrode.

Finally, the method for manufacturing the capacitive device may end with the formation of a passivation layer and opening of the latter at two contact points so as to electrically access to the upper electrode and to the lower electrode.

In particular, the contact points are metallic plots ("UBM").

Upon completion of the manufacturing method, the final stack is ready to be cut (FIG. 3F).

The method may also include a subsequent step during which capacitive devices formed over the same substrate 10 are separated at the cutting areas Z4.

The capacitive device obtained in this manner is remarkable in that it includes a covered nanopillar layer 20 formed full-plate.

The arrangement of the capacitive stack 30 allows defining a capacitive area Z1 (first area) and a lower contact area Z2 (second area) within the capacitive device. In particular, the capacitive area is an area at which the capacitive stack encapsulates the nanopillars, whereas the lower contact area is an area at which on the one hand the capacitive stack leaves one end of the nanopillars uncovered while laterally covering the nanopillars.

Alternatively, the contact resumption may be formed by partially or totally filling the inter-pillar space, at the second area Z2, with an electrically-conductive element, for example copper, nickel, tungsten. This electrically-conductive element may be deposited by electrochemical deposition (ECD) or by atomic layer deposition (ALD).

A neutral area Z3 (third area) is interposed between the capacitive area Z1 and the lower contact area Z2. Opposite the neutral area Z3, there is no capacitive stacking. In other words, at the neutral area, the nanopillars are covered by all of the layers of the capacitive stack.

The neutral area Z3 may be covered with at least one encapsulation layer made of an insulating material. In particular, the encapsulation layer may comprise a silicon oxide layer or a silicon nitride layer. It is also possible to have a bilayer comprising a silicon nitride layer covering the silicon oxide layer.

Illustrative and Non-Limiting Examples of One Embodiment

Figure 4A:
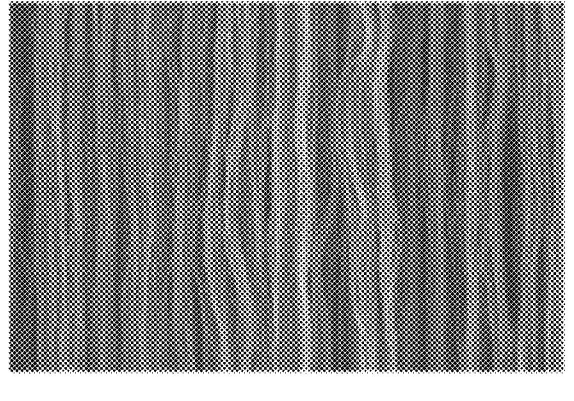
FIGS. 4A to 4D are photographs obtained by scanning electron microscopy of nanopillars (carbon nanotubes) obtained on different substrates having different structures, according to different embodiments of the invention, respectively over a substrate made of aluminium anodised at 60V covered with a catalytic layer made of iron, over a substrate made of aluminium anodised at 90V covered with a catalytic layer made of iron, over a planar substrate made of alumina covered with a catalytic layer made of iron, over a planar substrate made of alumina covered with a catalytic Fe/Ti/Al/Fe stack; the scale bar corresponds to 200 μm.
Figure 4A:
Figure 4B:
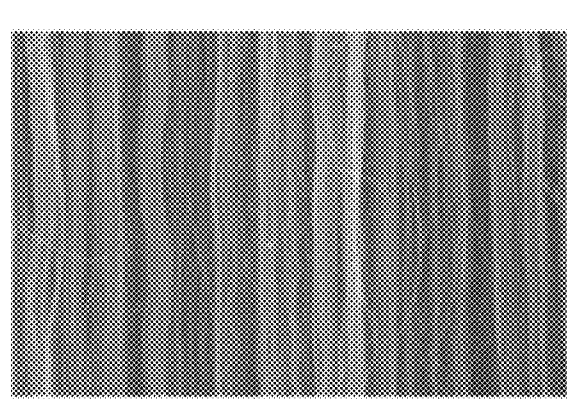
Figure 4C:
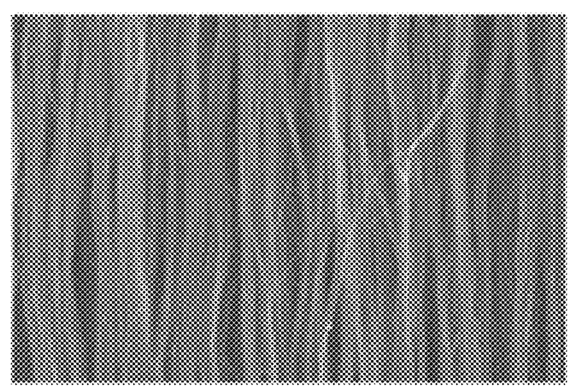
Figure 4D:
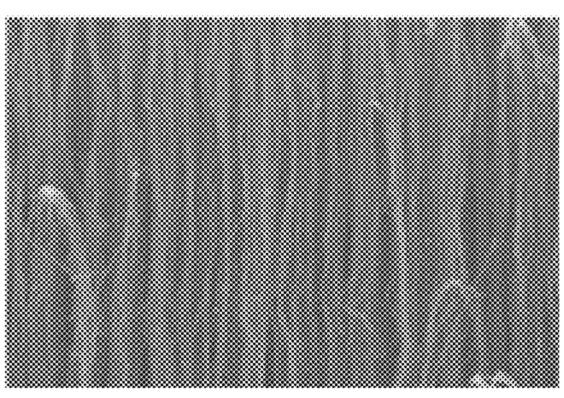

Different nanopillar (carbon nanotubes) layers have been observed with scanning electron microscopy (SEM). They have been obtained on substrates comprising a main layer 11 made of aluminium/alumina having different textures and covered with a catalytic layer or with a catalytic stack of different natures:

- a main layer 11 made of aluminium anodised at 60V covered with a catalytic layer made of iron (FIG. 4A),
- a main layer made of aluminium anodised at 90V covered with a catalytic layer made of iron (FIG. 4B),
- a planar main layer made of $Al_2O_3$ covered with a catalytic layer made of iron (FIG. 4C),
- a planar main layer made of $Al_2O_3$ covered with a Fe/Ti/Al/Fe catalytic stack (FIG. 4D).

The obtained CNT densities are different on these different substrates.

In the following examples 1 and 2, we will describe in more detail methods for manufacturing a capacitive device. The natures and thicknesses of the conductive or insulating layers are given for indication.

Example 1

Deposition of a 500 nm full-plate dielectric layer 12 of $SiO_2$ ($SiH_4$) over a Silicon support 13, 2) Deposition of a 3 μm full-plate main layer 11 of Aluminium, 3) Anodisation of about 1 μm of the main Aluminium layer 11 (it is possible to tune the anodising voltage, the temperature of the bath and the electrolyte to define "the arrangement" of the formed alumina, in particular the spacing ("pitch"), 4) Etching of the formed alumina to reveal an organised preformed Al surface (FIG. 3A), 5) Deposition of 200 nm of a $SiO_2$ layer 52 (TEOS for example), 6) Chemical-mechanical etching of the $SiO_2$ layer 52 ("smoothing"), 7) Structuring of the $SiO_2$ layer 52 by photolithography and then etching of the $SiO_2$ and Al with stoppage at the $SiO_2$ layer 12 deposited at step 1) to form the area Z4, 8) Deposition of an $Al_2O_3$ layer 51 by ALD, 9) Opening of the $Al_2O_3$ and $SiO_2$ layers 51 and 52, lithography and dry etching with stoppage at the aluminium layer 11 (FIG. 3B),
10) Deposition of the catalyst and growth of the carbon or CNT nanotube layer 20 (FIG. 3C):

Braided growth over the first area Z1 (capacitive area) and over the second area Z2 (contact resumption area of the lower electrode) with a considerable free space (in general a 60 nm space with a 140 nm pitch is targeted).

Growth over the third area Z3 (insulating area of the upper electrode) and over the fourth area Z4 (separation area of the lower electrodes and the scribe lines) without a specifically braided formation and with a small free space (for example in the range of 10 to 20 nm), 11) Deposition of an insulating layer 32 of $Al_2O_3$ by ALD (FIG. 3C),
12) Deposition of a 200 nm $SiO_2$ layer, then
13) Deposition of a 100 nm SiN layer, so as to form a mask 40,
14) Structuring of the SiN, lithography etching of the SiN with stoppage at the $SiO_2$, photo-sensitive resin removal ("stripping") and definition of the capacitive area Z1,
15) Opening of the $SiO_2$ on the $Al_2O_3$ through the SiN hard mask-dry etching (FIG. 3D),
16) Deposition of a 10 nm TiN conductive layer 33 by ALD (FIG. 3E), to form an IM-type capacitive stack 30,
17) Deposition of 1 μm of Al or AlCu or AlSi, to form an upper electrode 60,
18) Structuring of the Alu "upper electrode" plot, lithography and Alu etching with stoppage at the TiN,
19) Dry etching of the TiN with stoppage at the SiN through the Alu hard mask,
20) Passivation with a 100 nm SiN layer 61,
21) Structuring of the SiN, lithography etching of the SiN with stoppage at the $SiO_2$, photo-sensitive resin removal ("stripping"), and definition of the contact resumption area Z2,
22) Opening of the $SiO_2$ on the $Al_2O_3$ through the SiN hard mask (dry etching),
23) $Al_2O_3$ etching with stoppage on the CNT (dry etching with over-etching),
24) Deposition of 1 μm of Al or AlCu, to form a lower electrode 70,
25) Structuring of the AlCu "lower electrode" plot, lithography and Alu etching with stoppage at the SiN,
26) Opening of the SiN passivation on the "upper electrode" plot, lithography and SiN etching with stoppage at the AlCu (FIG. 3F),
27) Discretisation of the devices (along the scribe lines in the area without the Alu layer, area Z4).

Example 2

Steps 1) to 10) of the example 1) are carried out and then the following steps:

11) Full-plate ALD deposition of the "MIM"-type capacitive stack 30, formed by a lower conductive layer 31 (for example 10 nm of TiN), an insulating layer 32 (20 nm of $Al_2O_3$ for example) and an upper conductive layer 33 (10 nm of TiN for example),
12) AlCu deposition to form an upper electrode 60,
13) Structuring of the AlCu "upper electrode" plot ("patterning"), AlCu and TiN etching (stoppage at the $Al_2O_3$),
14) Deposition of a SiN layer 61, then SiN opening,
15) AlCu deposition, to form a lower electrode 70,
16) Structuring of the Alu "lower electrode" plot, lithography and Alu etching with stoppage at the SiN,
17) Opening of the SiN passivation on the "upper electrode" plot lithography and SiN etching with stoppage at the AlCu,
18) Discretisation of the devices (along the scribe lines in the area without the Alu layer, area Z4).

Variants of the Examples 1 and 2

In the example 1, it is also possible to carry out a prior deposition of a conductive layer 31 of TiN by ALD over the CNT braids, before step 8), to form a MIM-type capacitive stack.

In the examples 1 and 2, it is possible to use two different catalytic stacks in the capacitive and insulating areas so as to obtain different CNT densities in the two areas.

In the examples 1 and 2, it is possible not to deposit $SiO_2$ (step 5) and/or not to carry out the planarisation step on the insulating area (step 6).

Two different catalytic stacks may then be used in the capacitive and insulating areas so as to obtain different CNT densities in the two areas.

According to another variant, two different anodisation processes may be used in the capacitive and insulating areas (for example an anodisation at 90V in the capacitive area and an anodisation at 60V in the insulating area) to obtain different structures of the Aluminium layer and thus different CNT densities after growth.

The invention claimed is:

1. A method for manufacturing a capacitive device comprising the following steps:

i) providing a substrate comprising:
   a first area made of a first material and/or having a first texture,
   a second area made of a second material and/or having a second texture,
   a third area arranged between said first area and said second area, said third area being made of a third material and/or having a third texture, the first material being different from the third material and/or the first texture being different from the third texture, the first material may be identical to or different from the second material and/or the first texture may be identical to or different from the second texture, ii) making nanopillars grow over the substrate, with which a nanopillar layer is obtained locally having different densities, the nanopillars at the first area having a first density, the nanopillars at the second area having a second density, the nanopillars at the third area having a third density, the first density and the second density being lower than the third density, the first density may be identical to or different from the second density, iii) forming an insulating layer over the nanopillar layer, the insulating layer covering the nanopillars in a conformal and continuous manner at least at the first area, iv) forming a conductive layer, over the nanopillar layer, the conductive layer covering the insulating layer in a conformal and continuous manner at least at the first area, so as to form a capacitive stack at the first area, the capacitive stack comprising the insulating layer and the conductive layer, wherein the conductive layer is prevented from forming between the nanopillars at the third area, thereby defining an electrically insulating area between the first area and the second area.

2. The method according to claim 1, wherein steps iii) and iv) are carried out by full-plate depositing the insulating layer and the conductive layer, the insulating layer and the conductive layer covering the nanopillar layer in a conformal manner at the first area and at the second area, so as to form a contact resumption at the second area, the insulating layer plugging the space between the nanopillars at the third area so as to prevent the forming of the conductive layer between the nanopillars at the third area.

3. The method according to claim 1, wherein, between steps iii) and iv), the method includes a step during which a mask is formed over the nanopillar layer at the third area such that the mask prevents the forming of the conductive layer at the third area.

4. The method according to claim 3, wherein the mask covers the nanopillar layer at the second area and at the third area.

5. The method according to claim 1, wherein, at the first area and/or at the second area, the spacing between the nanopillars is comprised between 60 nm and 140 nm.

6. The method according to claim 1, wherein, at the third area (Z3), the spacing between the nanopillars is comprised between 10 nm and 20 nm.

7. The method according to claim 1, wherein the method includes an additional step, between step ii) and step iii), during which an additional conductive layer is deposited, the capacitive stack of the first area comprising the additional conductive layer, the insulating layer and the conductive layer.

8. The method according to claim 1, wherein the substrate provided at step i) comprises a main aluminium layer covered with an oxide layer having through openings leading onto the main aluminium layer, a first through opening corresponding to the first area and a second through opening corresponding to the second area, a portion of the oxide layer disposed between the first area and the second area corresponding to the third area.

9. The method according to claim 1, wherein the substrate provided at step i) comprises a main layer made of aluminium covered with a first catalyst and with a second catalyst, the first area and the second area being formed at the first catalyst and the third area being formed at the second catalyst, an oxide layer may be disposed between the main layer made of aluminium and the second catalytic layer.

10. The method according to claim 1, wherein the substrate provided at step i) is obtained according to the following steps:

a) provide a substrate comprising a main aluminium layer,
b) locally structure a first portion of the main aluminium layer by a first anodising process, so as to define a first area,
c) locally structure a second portion of the main aluminium layer by a second anodising process, so as to define a second area,
d) locally structure a third portion of the main aluminium layer by a third anodising process, so as to define a third area,
e) carry out an etching step, with which a structured main aluminium layer is obtained comprising a first structure at the first area, a second structure at the second area and a third structure at the third area, the first structure being different from the third structure, the first structure being identical to or different from the second structure.

11. The method according to claim 1, wherein the substrate rests on a support comprising a dielectric layer, a trench being formed through the substrate up to the dielectric layer covering the support, the trench forming a fourth area, and wherein during step ii) nanopillars are grown at the fourth area, the nanopillars having a fourth density, the fourth density being higher than the first density and than the second density.

12. The method according to claim 11, wherein the dielectric layer is made of silicon oxide.

13. The method according to claim 1, wherein the nanopillars are carbon nanotubes or metal nanowires.

14. A method for manufacturing a capacitive device comprising the following steps:

i) providing a substrate comprising:
 a first area made of a first material and/or having a first texture,
 a second area made of a second material and/or having a second texture,
 a third area arranged between said first area and said second area, the third area being made of a third material and/or having a third texture, the first material being different from the third material and/or the first texture being different from the third texture,
ii) making nanopillars grow over the substrate, with which a nanopillar layer is obtained locally having different densities, the nanopillars at the first area having a first density, the nanopillars at the second area having a second density, the nanopillars at the third area having a third density, the first density and the second density being lower than the third density,
iii) forming an insulating layer over the nanopillar layer, the insulating layer covering the nanopillars in a conformal and continuous manner,
iv) forming a conductive layer, over the nanopillar layer, so that the conductive layer covering the insulating layer in a conformal and continuous manner at the first area, a capacitive stack being formed at the first area, the capacitive stack comprising the insulating layer and the conductive layer, the conductive layer not being deposited between the nanopillars at the third area, thereby defining an electrically insulating area between the first area and the second area.

15. The method according to claim 1, wherein the insulating layer is deposited so as to entirely fill the spaces between the nanopillars at the third area so that the deposition of the conductive layer is prevented between the nanopillars at the third area or wherein a mask is formed over the nanopillar layer at the third area so that the deposition of the conductive layer at the third area is prevented by the mask.

16. A method for manufacturing a capacitive device, comprising:

i) providing a substrate comprising at least a first region and an adjacent second region;
ii) growing a nanopillar layer over the substrate, such that:
 the first region comprises nanopillars having a first density, and
 the second region comprises nanopillars having a second density higher than the first density;
iii) depositing an insulating layer conformally over the nanopillar layer, wherein the insulating layer covers the nanopillars in both the first and second regions, and substantially fills the spaces between the nanopillars in the second region; and iv) depositing a conductive layer over the insulating layer, wherein:

the conductive layer covers the insulating layer in the first region in a conformal and continuous manner, forming a capacitive stack comprising the insulating layer and the conductive layer in the first region, and wherein deposition of the conductive layer is substantially prevented in the second region due to the insulating layer filling the spaces between the nanopillars, such that the second region remains electrically insulating.

17. The method of claim 16, wherein the insulating layer entirely fills the spaces between the nanopillars in the second region, thereby physically blocking the deposition of the conductive layer between the nanopillars in the second region.

18. The method of claim 16, wherein the nanopillars in the first region are spaced between approximately 60 nm and 140 nm, and the nanopillars in the second region are spaced between approximately 10 nm and 20 nm.

19. The method of claim 16, wherein the nanopillars are carbon nanotubes or metal nanowires.

* * * * *